(12) United States Patent  
Kurotsu

(10) Patent No.: US 6,212,106 B1
(45) Date of Patent: Apr. 3, 2001

(54) MULTI-BIT MATCH DETECTION CIRCUIT

(75) Inventor: Satoru Kurotsu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/326,558

(22) Filed: Jun. 7, 1999

(30) Foreign Application Priority Data

Aug. 24, 1998 (JP) .................................... 10-236802

(51) Int. Cl.⁷ ........................................ G11C 7/00
(52) U.S. Cl. ........................... 365/189.07; 365/49
(58) Field of Search ................ 365/185.03, 189.07, 365/49, 205

(56) References Cited

U.S. PATENT DOCUMENTS

| | | | |
|---|---|---|---|
| 5,396,448 | * 3/1995 | Takayanagi et al. | 365/49 |
| 5,396,449 | * 3/1995 | Atallah et al. | 365/49 |
| 5,694,362 | * 12/1997 | Zhang et al. | 365/189.07 |
| 5,699,288 | * 12/1997 | Kim et al. | 365/189.07 |
| 5,715,426 | * 2/1998 | Takahashi et al. | 365/189.07 |
| 5,982,675 | * 11/1999 | Fujimoto | 365/189.07 |
| 5,999,435 | * 12/1999 | Henderson et al. | 365/49 |

OTHER PUBLICATIONS

Osada et al., "A 2ns Access, 285MHz, Two–Port Cache Macro using Double Global Bit–Line Pairs" 1997 IEEE International Solid–State Circuits Conference, pp. 402–403.

Mizuno et al., "A 1V 100MHz 10mW Cache using Separated Bit–Line Memory Hierarchy and Domino Tag Comparators" 1996 IEEE International Solid State Circuits Conference, pp. 152–153.

* cited by examiner

Primary Examiner—Son T. Dinh
(74) Attorney, Agent, or Firm—Jones Volentine, LLC

(57) ABSTRACT

Complementary read signals Bi, /Bi applied to bit line pair $1_i$, $2_i$ are compared with complementary address signals Ai, /Ai in a comparison unit $10_i$. The result of the comparison is output to output lines $15_i$, $16_i$ as complementary detection signals. The detection signals on the output lines $15_i$, $16_i$ are applied to the amplifier unit $20_i$ which starts amplifying operation, when the level "H" is applied to terminals E. An enable signal EN from outside of the circuit is applied to the first stage amplifier unit $20_1$ of the first group and the first stage amplifier unit $20_{n+1}$ of the second group, of which output signals are applied to the terminals E of the succeeding amplifier units $20_2$ to $20_n$, and $20_{n+2}$ to $20_{2n}$. With this structure, the amount of electric consumption can be reduced with scarcely increasing time required for operation.

6 Claims, 8 Drawing Sheets

Operation when every corresponding bit matches

Operation when the most significant bits do not match

Operation when the less significant bits do not match

MULTI-BIT MATCH DETECTION CIRCUIT

BACKGROUND OF THE INVENTION

The present invention relates to a multi-bit match detection circuit provided in, for example, a cache memory, which detects if a multi-bit read signal read out from a memory cell matches a data signal, the object of comparison, with said read signal.

The following are known as the prior arts related to the present invention:

(Reference 1) IEEE International Solid-State Circuit Conference, (1996), Mizuno. H, et. al., "A 1V 100 MHz 10 mV Cache using Separated Bit-Line Memory Hierarchy and Domino Tag Comparators", pp. 152–153.

(Reference 2) IEEE International Solid-State Circuit Conference, (1997), Osada. K, et. al., "A 2 ns Access, 285 MHz, Two-Port Cache Macro using Double Global Bit-Line Pairs, pp. 402–403.

A cache memory is a memory which has a specific memory area for temporarily storing data for current operation of a processor, which data is stored in a main storage. Thus, the cache memory can access for read/write operation faster than the main storage. For this reason, the cache memory is provided with a multi-bit match detection circuit, which is called a tag comparator, for the purpose of detecting whether of not a copy of an address of the main storage is applied by the processor to the memory area of the cache memory.

FIG. 2 is a block diagram of a tag comparator in the prior art provided in a cache memory described in Reference 1.

The tag comparator includes n sets of comparison units $10_i$ (i=1 to n). Each comparison unit $10_i$ is connected with bit line pair $1_i$, $2_i$ of n sets of memory cells (not shown). From the bit line pair $1_i$, $2_i$, complementary read signals Bi, /Bi (/ indicates "reverse") are output. Each comparison unit $10_i$ is also connected with address line pair $3_i$, $4_i$. From the address line pair $3_i$, $4_i$, complementary tag address signals Ai, /Ai (/ indicates "reverse") are output.

Each comparison unit $10_i$ is structured identically. For example, a comparator unit $10_1$ has P-channel MOS transistors (hereinafter referred to as "PMOS") 11 and 13 and PMOS 12 and 14, constituting an exclusive OR (hereinafter referred to as "EOR") circuit. The comparison unit $10_1$ further comprises an output line $15_1$ for outputting EOR of a read signal B1 and a tag address signal A1, and an output line $16_1$ for outputting NOT of said EOR (hereinafter referred to as "ENOR").

Each output lines $15_i$, $16_i$ of the comparison units $10_i$ are connected with amplifier units $20_i$. Each amplifier unit $20_i$ is structured identically for amplifying a level of complementary signals output to the output lines $15_i$, $16_i$ to a predetermined logic level. For example, the amplifier unit $20_1$ has PMOS 21, 22 constituting a flip-flop type sense amplifier, N-channel MOS transistor (hereinafter referred to as "NMOS") 23, 24, and NMOS 25 for controlling operation of the sense amplifier.

An enable signal EN is applied to a gate of the NMOS 25 of the first stage amplifier unit $20_1$, to start comparison operation. The amplifier $20_1$ is designed to start operation when the enable signal EN is at "H" level. The output line $16_i$ of the $i^{th}$ stage amplifier unit $20_i$ is connected with the gate of the NMOS 25 of the succeeding stage amplifier unit $20_{i+1}$, operation of which is controlled sequentially by an output signal of the preceding stage amplifier unit $20_i$. A match signal HIT is output from the output line $16_n$ of the last stage amplifier unit $20_n$.

In addition, the tag comparator is provided with a decision unit 30 for deciding if every bit matches the corresponding bit of the object of comparison. The decision unit 30 comprises an output line 31 for outputting a mismatch signal MH at "L" level when any pair of the corresponding bits do not match each other, multiple NMOS $32_i$ for pulling down the output line 31 to "L" level when mismatch bits are found, and a PMOS 33 for pulling up the output line 31 to "H" level before decision by means of a pre-charge signal PRC.

The output line $15_i$ of the each amplifier unit $20_i$ is connected to the gate of a corresponding NMOS $32_i$. The drain of each NMOS $32_i$ is commonly connected with the output line 31, and the source of the same is connected to a ground potential GND.

The following operation is carried out in the above mentioned tag comparator.

First, the complementary tag address signals Ai, /Ai, which are the object of comparison, are applied to each address line pair $3_i$, $4_i$. Further, memory cells in which address data are stored are selected, and the complementary read signal Bi, /Bi read out from the n sets of memory cells are thereby output to the bit line pairs $1_i$, $2_i$, respectively. With this, the comparison results EOR, ENOR are output to the output lines $15_i$, $16_i$ of each comparison unit $10_i$, signal level of which are lower than the predetermined logic level.

Next, in order to start comparison operation, the enable signal EN is switched to "H" level so that the first stage amplifier unit $20_1$ is ready for operation. With this, the level of the signals at the output lines $15_1$, $16_1$ of the comparison unit $10_1$ are amplified to the predetermined logic level. At this stage, if the read signal B1 and the tag address signal A1 match, the output line $15_1$ is turned to "L" level, whereas the output line $16_1$ is turned to "H" level.

When the output line $16_1$ turns "H" level so as to enable the succeeding stage amplifier unit $20_2$ to start operation, the level of the signals at the output lines $15_2$, $16_2$ of the comparison unit $10_2$ are amplified to the predetermined logic level. At this stage, if the read signal B2 and the tag address signal A2 do not match, the output line $15_2$ is turned to "H" level, whereas the output line $16_2$ is turned to "L" level. With this, the NMOS $32_2$ is turned on and the output line 31 is turned to "L" level so that the mismatch signal MH indicating that the tag address signal Ai and the read signal Bi do not match is output. The third and succeeding amplifier units $20_3$ to $20_n$ do not start operation, because the output line $16_2$ is at "L" level.

In case that every corresponding bit of the tag address signal Ai and the read signal Bi match, the output line $16_i$ is switched to "H" level sequentially by means of each amplifier unit $20_i$. The output line $16_n$ of the last stage amplifier unit $20_n$ outputs the match signal HIT.

As mentioned above, the tag comparator is structured to compare the tag address signal Ai with the read signal Bi bit by bit, and output the mismatch signal MH when the mismatch bits are found, stopping subsequent comparison. Therefore, it is made possible to reduce electric consumption comparing with the multi-bit match detection circuit in which all the bits are compared at a time.

However, the following problems are yet to be solved with regard to the multi-bit match detection circuit, i.e. the tag comparator in the prior art.

The multi-bit match detection circuit in the prior art does not compare all the bits at a time so that the amount of electric consumption can be lowered. However, in the multi-bit match detection circuit in the prior art, designing of the timing circuit is rather difficult, and time required to output comparison result always differs depending on various kinds of data. Moreover, the large number of bits requires long time to obtain the comparison result. This increases delay time. The object of the invention is to solve the above mentioned problem and to provide a novel and improved multi-bit match detection circuit wherein the amount of electric consumption can be reduced with scarcely increasing time for operation.

SUMMARY OF THE INVENTION

According to the first feature of the present invention, which has been completed by addressing the above mentioned problem, there is provided a multi-bit match detection circuit which comprises multiple comparison units which compare multiple complementary read signals read out from memory cells with multiple data signals bit by bit, and output complementary detection signals indicating match/mismatch of every compared pair, multiple amplifier units each provided at each comparison unit which start operation when a control signals for controlling operation is applied, and generate output signals indicating match/mismatch of said every compared pair by amplifying said detection signals to the predetermined logic level, and a decision unit which decides if said multiple read signals and said multiple data signals match based on the output signals generated by said multiple amplifier units, wherein said multiple amplifier units are divided into two or more groups, and when the output signals indicating match of the corresponding bits are output from every first amplifier unit of every amplifier unit groups, rest of the amplifier units in every amplifier unit groups start operation at a time.

According to the first feature of the invention, by adopting the above-mentioned structure, the following operation is carried out.

The multiple read signals read out from the memory cells are compared at the multiple comparison units with the multiple data signals bit by bit, and the detection signals indicating match/mismatch of every compared bit are output. The multiple detection signals are applied to the corresponding amplifier units divided into two or more groups. When the output signals indicating match of the corresponding bits are output from every first amplifier unit of every amplifier unit groups, the rest of the amplifier units in every amplifier unit groups start operation at a time, outputting the output signals by amplifying the corresponding detection signals. The output signals of the multiple amplifier units are transmitted to the decision unit which decides if the read signal and the data signal match based on the output signals.

According to the second features of the invention, there is provided a multi-bit match detection circuit similar to the first feature of the invention wherein the multiple amplifier units are divided into two or more groups, and when the output signals indicating match of the corresponding bits are output from the preceding amplifier units of every amplifier unit groups, the amplifier unit succeeding said amplifier units start operation sequentially.

According to the second feature of the invention, by adopting the above-mentioned structure, the following operation is carried out.

The multiple read signals read out from the memory cells are compared at the multiple comparison units with the multiple data signals bit by bit, and the detection signals indicating match/mismatch of every compared bit are output. The multiple detection signals are applied to the corresponding amplifier units divided into two or more groups. When the output signals indicating match of the corresponding bits are output from the preceding amplifier units in each amplifier unit groups, the amplifier unit succeeding said amplifier unit starts operation sequentially, outputting the output signals by amplifying the corresponding detection signals. The output signals of the multiple amplifier units are transmitted to the decision unit which decides if the read signal and the data signal match based on the output signals.

According to the third features of the invention, there is provided a multi-bit match detection circuit as described in the first and the second features of the invention wherein a decision unit is divided into multiple decision groups corresponding to the amplifier unit groups of said amplifier units, and decision whether or not said multiple read signals and said multiple data signals match is made based on the detection results of every decision groups.

According to the third feature of the invention, by adopting the above-mentioned structure, the following operation is carried out.

The decision groups which are divided corresponding to the amplifier unit groups output the detection results obtained at the amplifier unit groups regarding match/mismatch. In addition, it is decided if the read signals and the data signals match based on the detection results of every decision groups.

According to the fourth features of the invention, there is provided a multi-bit match detection circuit by replacing the decision unit described in the first to third features of the invention with a decision unit comprising an output line with two complementary logic levels which outputs a first logic level when said multiple read signals and said multiple data signals match, and outputs a second logic level when said multiple read signals and said multiple data signals do not match, an MOS transistor (hereinafter referred to as "MOS") which charges said output line to said first logic level before match/mismatch decision, multiple bipolar transistors (hereinafter referred to as "TR") of which conduction are controlled by the output signals output from said multiple amplifier units, and which connect said output line with said second logic level when mismatch is found by said output signals.

According to the fourth embodiment of the invention, the following operation is carried out.

Before decision of match/mismatch, the MOS charges the output line to the first logic level indicating match. After start of decision, if mismatch is found in any of the output signals output from the multiple amplifier units, TR corresponding to the output signal is controlled to be in the conduction state, the output line is thereby connected with the second logic level indicating mismatch.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENTS OF THE INVENTION

The following is a detailed explanation of the preferred embodiments of a multi-bit match detection circuit according to the present invention in reference to the attached drawings.

First Embodiment

Figure 1:
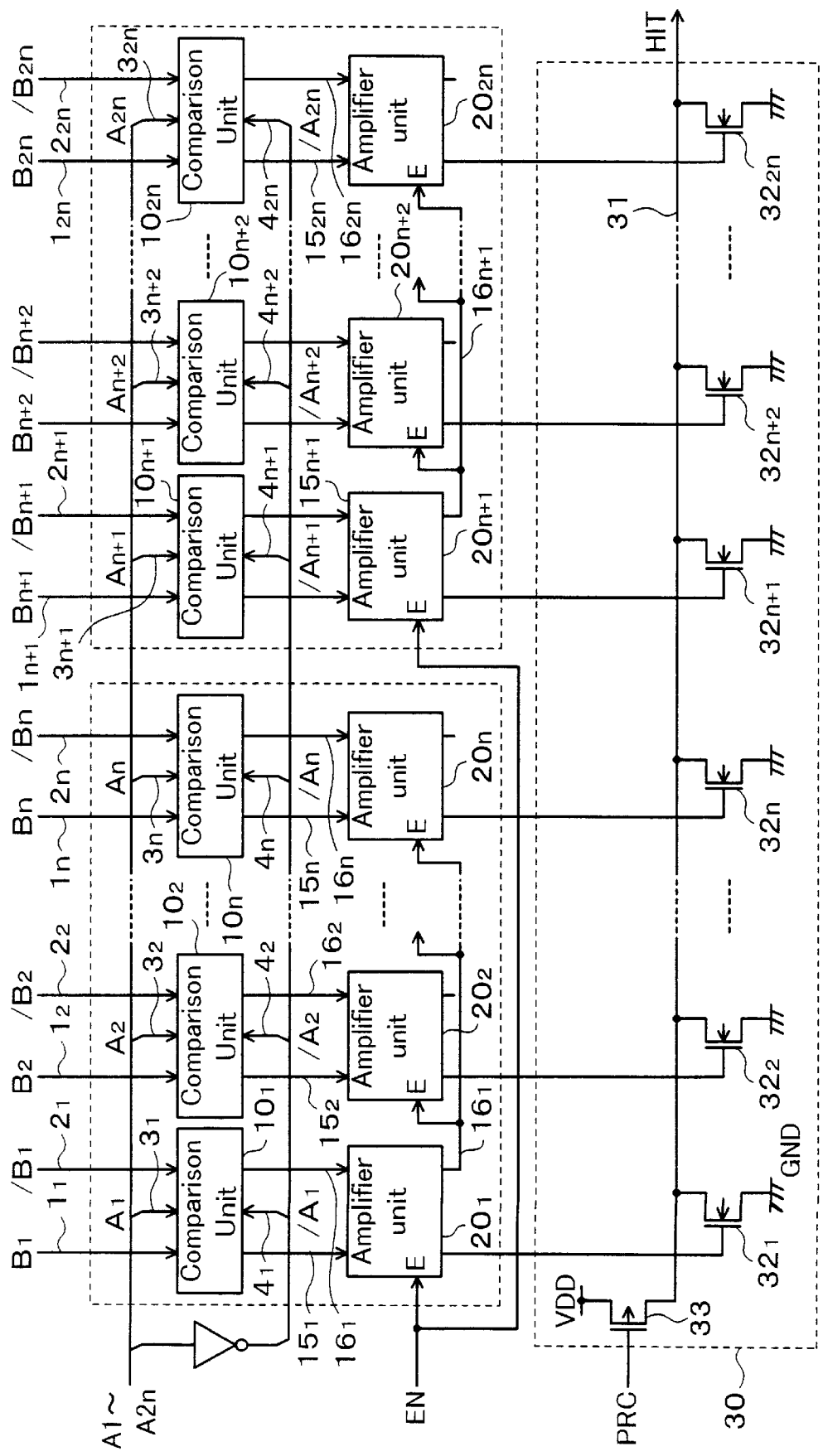
FIG. 1 is a block diagram illustrating the multi-bit match detection circuit according to the first embodiment of the present inventions
Figure 2:
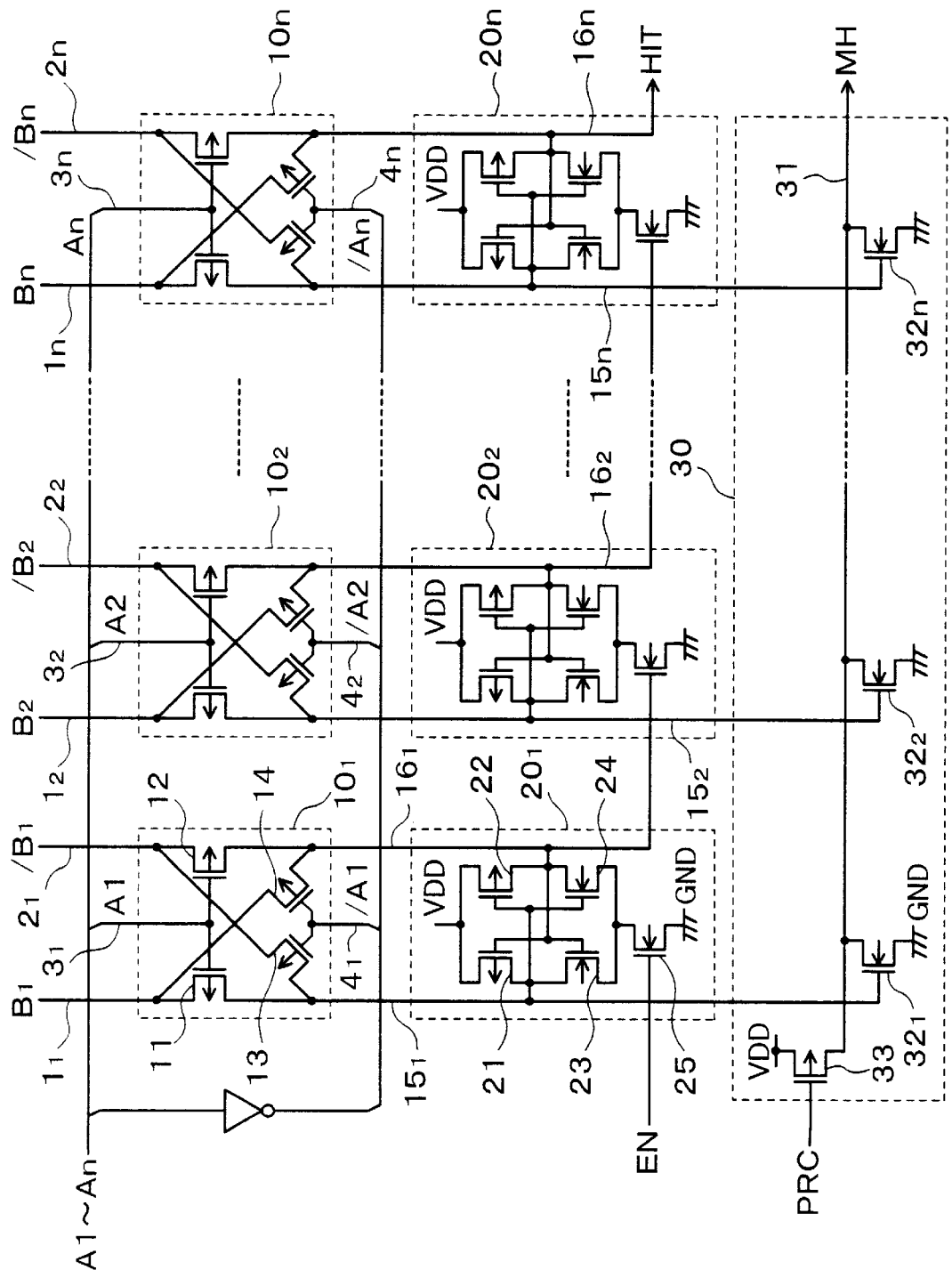
FIG. 2 is a block diagram of the tag comparator in the prior art.

FIG. 1 is a block diagram illustrating a multi-bit match detection circuit according to the first embodiment of the present invention. It is to be noted that in FIG. 1, the same reference numbers as FIG. 2 are assigned to components having approximately the same functions and structural features.

The multi-bit match detection circuit includes a first group with n sets of comparison units $10_1, 10_2, \ldots 10_n$ and n sets of amplifier units $20_1, 20_2, \ldots 20_n$, a second group with n sets of comparison units $10_{n+1}, 1_{n+2}, \ldots 10_{2n}$ and n sets of amplifier units $20_{n+1}, 20_{n+2}, \ldots 20_{2n}$. Each comparison unit $10i$ (i=1 to 2 n) is connected with bit line pair $1_i, 2_i$ of 2n sets of memory cells (not shown). The bit line pair $1_i, 2_i$ output complementary read signals Bi, /Bi. The comparison unit $10_i$ is also connected with address line pair $3_i, 4_i$, which output complementary address signals Ai, /Ai.

Each comparison unit $10_i$ has the identical structure to one another, with an output line $15_i$ which outputs EOR of the address signal Ai and the read signal Bi and an output line $16_i$ which outputs ENOR thereof.

The output lines $15_i, 16_i$ of the comparison unit $10_i$ are connected with the amplifier unit $20_i$. Each amplifier unit $20_i$ has the identical structure to one another, of which operation is controlled by an enable signal ENi applied to a terminal E of each amplifier unit $20_i$. The amplifier unit $20_i$ is activated when the enable signal ENi is at "H" level, and amplifies complementary detection signals EOR and ENOR which are output from the comparison unit $10_i$ to the output lines $15_i, 16_i$, to the predetermined logic level. When the enable signal ENi is at "L" level, the amplifier unit $20_i$ is in non-activated state.

The enable signal EN for starting the comparison detection operation is commonly applied to the terminals E of each first stage amplifier units $20_1, 20_{n+1}$ of the first and second groups. The output line $16_1$ of the amplifier unit $20_1$ in the first group is commonly connected to the terminals E of the other amplifier units in the first group $20_2$ to $20_n$, the output line $16_{n+1}$ of the amplifier unit $20_{n+1}$ of the second group is commonly connected to the terminals of the other amplifier units $20_{n+2}$ to $20_{2n}$ in the second group.

In addition, the multi-bit match detection circuit includes a decision unit 30 which decides if every bit of the address signal Ai and the read signal Bi completely match. The decision unit 30 comprises an output line 31 which outputs a detection signal HIT, which is at "H" level when every compared pair matches, but which is at "L" level when one or more bits do not match, 2 n NMOSs $32_i$ for pulling down the output line 31 to "L" level when mismatch bits are found, and a PMOS 33 which charges the output line 31 to "H" level by means of a pre-charge signal PRC before decision.

The output line $15_i$ of each amplifier units $20_i$ is connected with the gate of the corresponding NMOS $32_i$. The drain of the NMOS $32_i$ is commonly connected with the output line 31, whereas the source thereof is connected to the ground potential GND.

Figure 3:
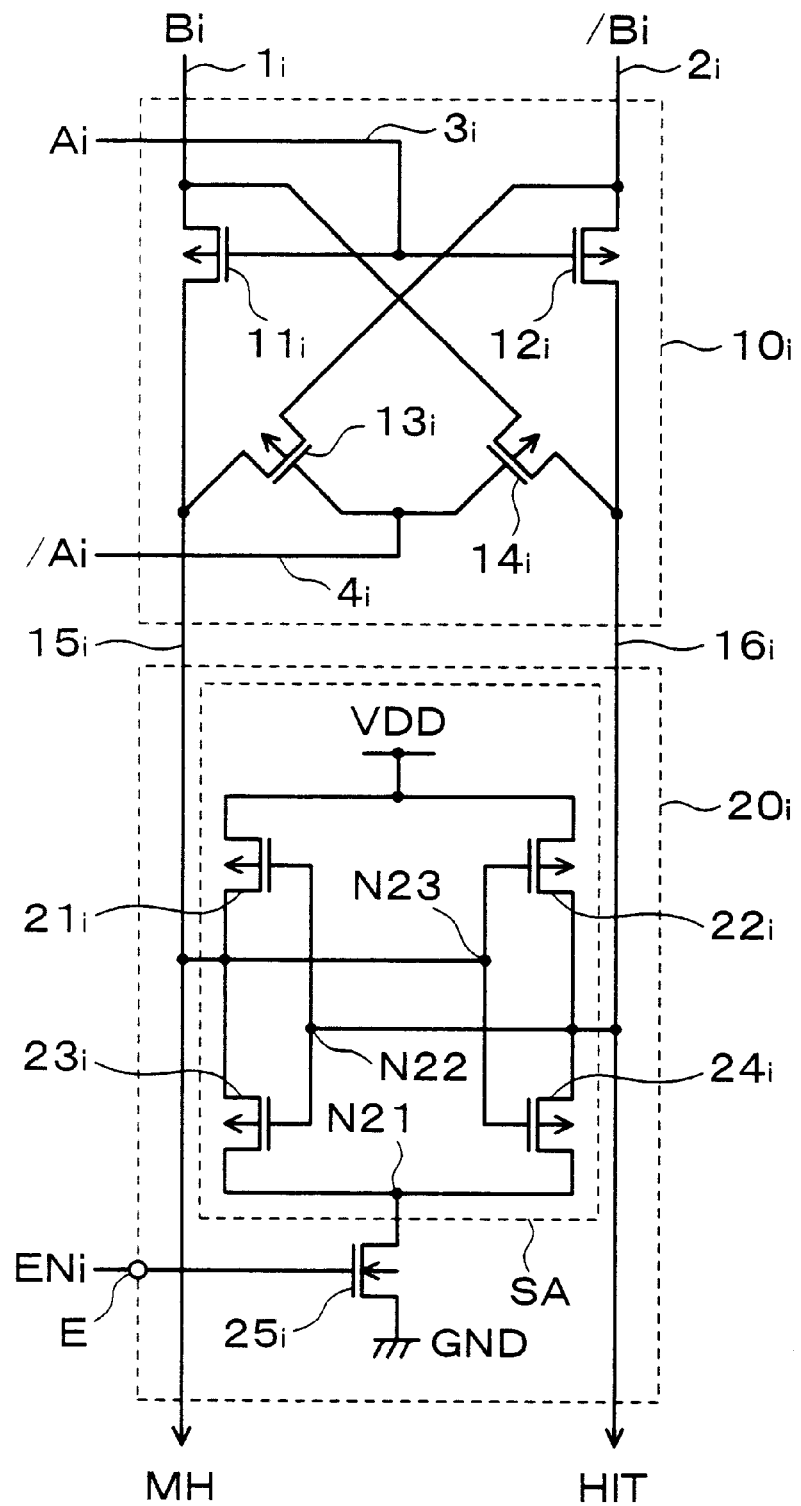
FIG. 3 is a circuit diagram of the comparison unit $10_i$ and the amplifier unit $20_i$ shown in FIG. 1.

FIG. 3 is a circuit diagram of the comparison unit $10_i$ and the amplifier unit $20_i$ shown in FIG. 1.

The comparison unit $10_i$ is a butterfly type comparator comprising 4 PMOSs $11_i, 12_i, 13_i$ and $14_i$. The PMOSs $11i$ and $12_i$, the gates of which are controlled by the address signal Ai from the address line $3_i$ are connected between the bit line $1_i$ and the output line $15_i$, and between the bit line $2_i$ and the output line $16_i$, respectively. So as to cross the above mentioned structure, the PMOSs $13_i$ and $14_i$, gates of which are controlled by the address signal /Ai from the address line $4_i$ are connected between the bit line $2_i$ and the output line $15_i$, and between the bit line $1_i$ and the output line $16_i$, respectively.

By adopting the above mentioned structure, when the address signal Ai is at "L" level, the PMOSs $11_i$ and $12_i$ are turned on so that the signal of the bit line pair $1_i$ and $2_i$ is output to the output lines $15_i, 16_i$. When the address signal Ai is at "H" level, the PMOSs $13_i$ and $14_i$ is turned on so that the signal of the bit line pair $1_i$ and $2_i$ is output to the output lines $16_i, 15_i$. Thus, EOR of the address signal Ai and the read signal Bi is output to the output line $15_i$, whereas ENOR of the address signal Ai and the read signal Bi is output to the output line $16_i$.

The amplifier unit $20_i$ is also provided with a flip-flop type sense amplifier SA comprising PMOSs $21_i, 22_i$ and NMOSs $23_i, 24_i$. The drains of the PMOSs $21_i, 22_i$ are commonly connected with a power source potential VDD and the sources thereof are connected with the drains of the NMOSs $23_i, 24_i$, respectively. The sources of the NMOSs $23_i, 24_i$ are commonly connected with a node N21.

The gates of the PMOS $21_i$ and the NMOS $23_i$ are connected with a node N22, which is connected with the source of the PMOS $22_i$, the drain of the NMOS $24_i$ and the output line $16_i$. The gates of the PMOS $22_i$ and the NMOS $24_i$ are connected to a node N23 which is connected with the source of the PMOS $21_i$, the drain of the NMOS $23_i$ and the output line $15_i$.

The node N21 is connected with the drain of the NMOS $25_i$, the source of which is connected with the ground potential GND. The gate of the NMOS $25_i$ is connected with the terminal E to which the enable signal ENi is applied.

In the amplifier unit $20_i$ structured as mentioned above, the sense amplifier SA is activated when the enable signal ENi applied to the terminal E is at "H" level. If the electric potential of the node N22 is higher than that of the node N23, the NMOS $23_i$ is turned on and the electric potential of the node N23 is turned to "L" level. Consequently, the electric potential of the node N22 further rises to "H" level. On the contrary, if the electric potential of the node N22 is lower than that of the node N23, the NMOS $24_i$ is turned on and the electric potential of the node N22 is turned to "L" level. Consequently, the electric potential of the node N23 further rises to "H" level. As is mentioned so far, the amplifier unit $20_i$ is constituted to be controlled its operation by the enable signal ENi, and when activated, to amplify the complementary detection signals EOR and ENOR output from the comparison unit $10_i$ to the output lines $15_i$ and $16_i$, to the predetermined logic level, "H" or "L".

Figure 4A:
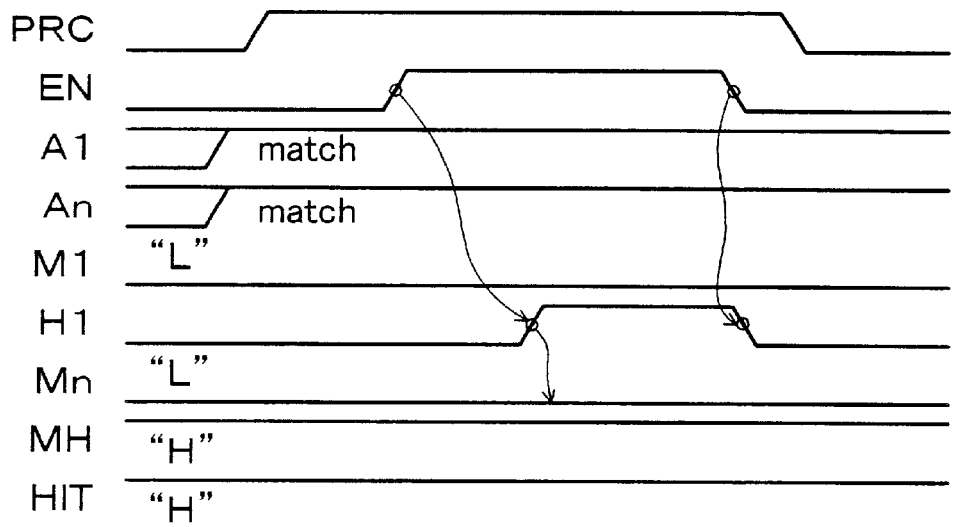
FIGS. 4a, 4b, and 4c are signal waveform diagram showing the operation of the multi-bit match detection circuit shown in FIG. 1.
Figure 4B:
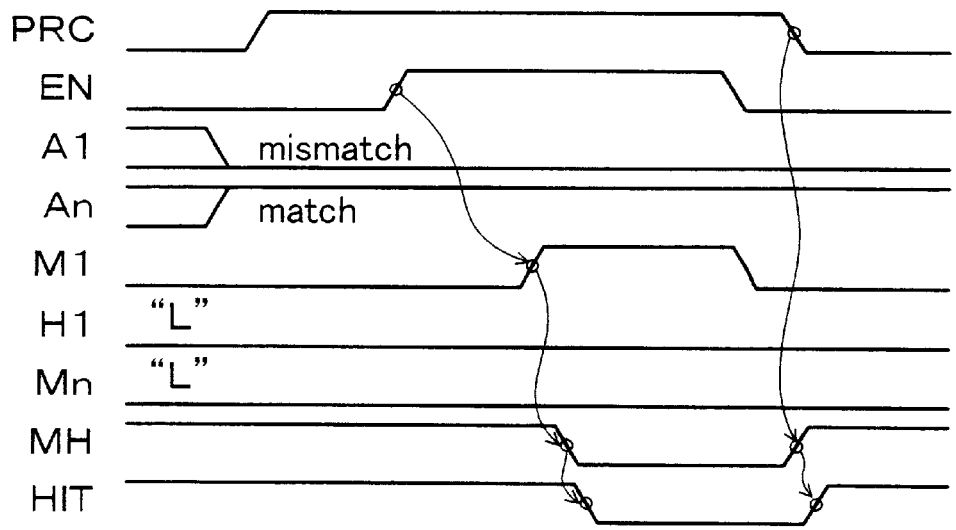
Figure 4C:
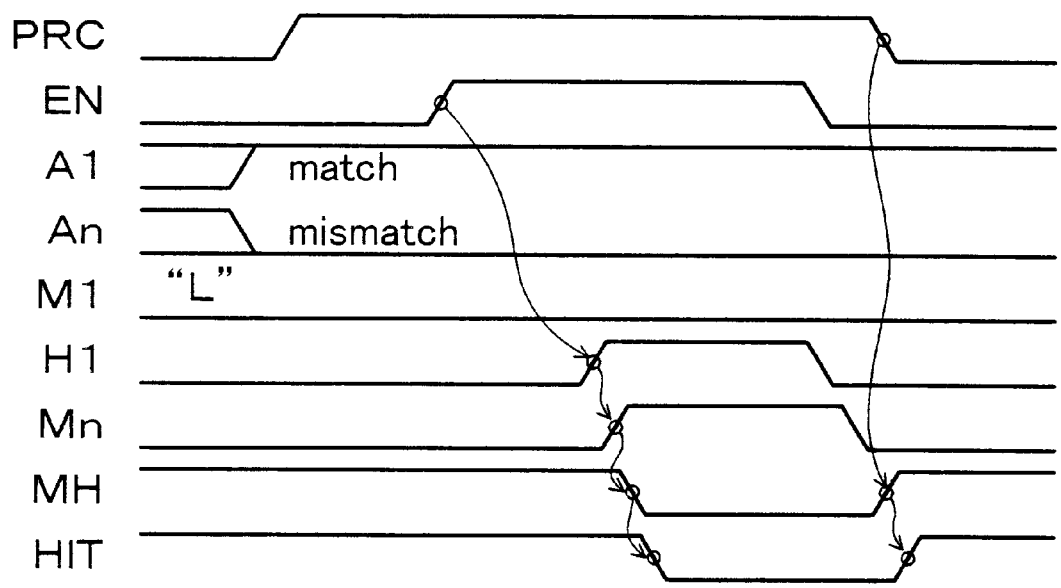

FIGS. 4(a) to (c) are signal waveform diagrams illustrating the operation of the multi-bit match detection circuit shown in FIG. 1, with FIG. 4(a) showing the waveform of the signals when every corresponding bit matches, FIG. 4(b) showing the waveform of the signals when the most significant bits do not match, and FIG. 4(c) showing the waveform of the signals when the less significant bits do not match.

In the following, the operation of the multi-bit match detection circuit according to the first embodiment of the invention ((I) to (III)) is explained with reference to FIGS. 4(a) to (c).

(I) Operation at "Hit" (when Every Corresponding Bit Matches)

First, the object of comparison, the complementary address signals Ai, /Ai are applied to the address line pair $3_i$, $4_i$. In addition, memory cells of the specific address are selected, and the complementary read signals Bi, /Bi, which is read out from n sets of memory cells are output to the bit line pair $1_i$, $2_i$, respectively. Consequently, the detection signals EOR and ENOR of the comparison result are output to the output lines $15_i$, $16_i$ of each comparison unit $10_i$. However, as the level difference of the read signals Bi, /Bi read out from the memory cells is smaller than that of the predetermined logic level, the signal level of the output line $15_i$, $16_i$ are low, more particularly, lower than the predetermined logic level.

Next, the enable signal EN at "H" level for starting comparison operation is applied so that the first stage amplifier unit $20_1$ in the first group and the first stage amplifier unit $20_{n+1}$ in the second group are ready for operation. Consequently, the signals of the output lines $15_1$, $16_1$ of the comparison unit $10_1$ are amplified to the predetermined logic level. At the same time, the signals of the output lines $15_{n+1}$, $16_{n+1}$ of the comparison unit $10_{n+1}$ are also amplified to the predetermined logic level. At this stage, if the read signal B1 and the address signal A1 match, the level of the output line $15_1$ is at "L", whereas that of the output line $16_1$ is at "H". Similarly, if the read signal Bn+1 and the address signal An+1 match, the level of the output line $15_{n+1}$ is at "L", whereas that of the output line $16_{n+1}$ is at "H".

With the output line $16_1$ switched to "H" level, the rest of the amplifier units $20_2$ to $20_n$ of the first group are ready for operation, and the signals of the output lines $15_2$ to $15_n$, $16_2$ to $16_n$ of the comparison units $10_2$ to $10_n$ are amplified to the predetermined logic level. Similarly, with the output line $16_{n+1}$ switched to "H" level, the rest of the amplifier units $20_{n+2}$ to $20_{2n}$ of the second group are ready for operation, and the signals of the output lines $15_{n+2}$ to $15_{2n}$, $16_{n+2}$ to $16_{2n}$ of the comparison units $10_{n+2}$ to $10_{2n}$ are amplified to the predetermined logic level.

When all corresponding bits of the 2 n bit address signal Ai and the 2 n bit read signal Bi match, the output line $15_i$ amplified by the amplifier unit $20_i$ are turned to "L" level so as to preserve the level of the detection signal HIT output from the output line 31 at "H" level which indicates "match".

(II) The Operation when the Most Significant Bits do not Match

The enable signal EN at "H" level for starting comparison operation is applied so that the first stage amplifier unit $20_1$ of the first group and the first stage amplifier unit $20_{n+1}$ of the second group are ready for operation. Consequently, the signals of the output lines $51_1$, $16_1$ of the comparison unit $10_1$ are amplified to the predetermined level. At the same time, the signals of the output lines $15_{n+1}$, $16_{n+1}$ of the comparison unit $10_{n+1}$ are also amplified to the predetermined level. At this stage, if the read signal B1 and the address signal A1 do not match, the level of the output line $15_1$ is at "H", whereas that of the output line $16_1$ is at "L".

(III) The Operation when the Less Significant Bits do not Match

The enable signal EN at "H" level for starting comparison operation is applied so that the first stage amplifier unit $20_1$ of the first group and the first stage amplifier unit $20_{n+1}$ of the second group are ready for operation. Consequently, the signals of the output lines $15_1$, $16_1$ of the comparison unit $10_1$ are amplified to the predetermined logic level. At the same time, the signals of the output lines $15_{n+1}$, $16_{n+1}$ of the comparison unit $10_{n+1}$ are also amplified to the predetermined logic level. At this stage, if the read signal B1 and the address signal A1 match, the level of the output line $15_1$ is at "L", whereas that of the output line $16_1$ is at "H". Similarly, if the read signal Bn+1 and the address signal An+1 match, the level of the output line $15_{n+1}$ is at "L", whereas that of the output line $16_{n+1}$ is at "H".

With the output line $16_1$ switched to "H" level, the rest of the amplifier units $20_2$ to $20_n$ of the first group are ready for operation, and the signals of the output lines $15_2$ to $15_n$, $16_2$ to $16_n$ of the comparison units $10_2$ to $10_n$ are amplified to the predetermined logic level at a time. Similarly, with the output line $16_{n+1}$ switched to "H" level, the rest of the amplifier units $20_{n+2}$ to $20_{2n}$ of the second group are ready for operation, and the signals of the output lines $15_{n+2}$ to $15_{2n}$, $16_{n+2}$ to $16_{2n}$ of the comparison units $10_{n+2}$ to $10_{2n}$ are amplified to the predetermined logic level.

At this stage, if the read signal Bi and the address signal Ai do not match, the output line $15_i$ corresponding to the mismatch read signal Bi is turned to "H" level. Consequently, the NMOS $32_i$ controlled by the output line $15_i$ is turned on, the detection signal HIT of the output line 31 is thereby turned to "L" level indicating that the address signal Ai and the read signal Bi do not match.

As mentioned above, according to the multi-bit match detection circuit of the first embodiment of the invention, the first bit of the address signal Ai is compared with the first bit of the read signal Bi. When the first bits of the address signals Ai and read signals Bi match, comparison of the other bits starts at a time, but when the first bits of the address and read signals do not match, comparison is terminated. With this structure, it is made possible to reduce electric consumption compared with the match detection circuit in which all the bits are compared at a time, at the same time, the multi-bit match detection circuit according to the present invention operates at higher speed than the tag comparator shown FIG. 2, which compares every bit one by one. Moreover, it is also advantageous in that time required to obtain the comparison result is always stable.

Second Embodiment

Figure 5:
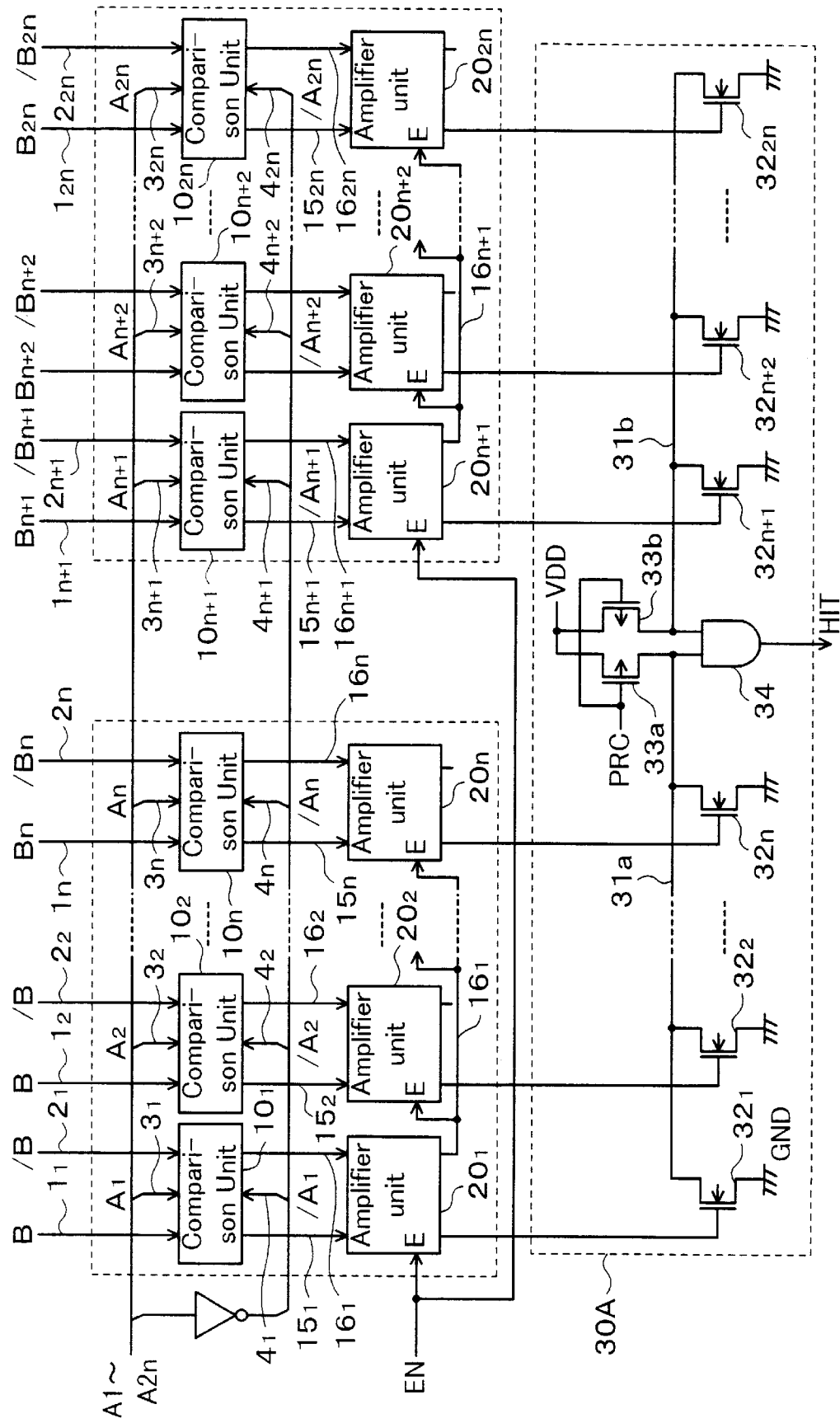
FIG. 5 is a block diagram illustrating the multi-bit match detection circuit according to the second embodiment of the present invention.

FIG. 5 is a block diagram illustrating a multi-bit match detection circuit according to the second embodiment of the invention. It is to be noted that in FIG. 5, the same reference numbers in FIG. 1 are assigned to components having approximately the same functions and structural features.

In the multi-bit match detection circuit according to the second embodiment of the invention, the decision unit 30 of the first embodiment is replaced with a decision unit 30A having a different structure from the decision unit 30.

In the decision unit 30A includes, the output line 31 is replaced by two output lines 31a and 31b, with the output line 31a which decides the comparison result of the first group and outputs the detection result, and the output line 31b which decides the comparison result of the second group and outputs the detection result. PMOSs 33a and 33b are provided in order to charge the output lines 31a and 31b to "H" level, respectively, by means of the pre-charge signal PRC before starting decision. In addition, the AND gate with two inputs 34 (hereinafter referred to as "AND") carries out the AND of the output lines 31a and 31b, and the detection signal HIT is output from the output of the AND 34. The other structures and operations of the multi-bit match detection circuit according to the second embodiment of the invention are identical to the multi-bit match detection circuit according to the first embodiment of the invention as shown in FIG. 1.

As mentioned above, the multi-bit match detection circuit according to the second embodiment of the invention is provided with the output lines 31a and 31b which output the detection result of the first and the second groups, respectively. In addition to the advantages obtained by the first embodiment of the invention, it is also made possible to operate at higher speed, because the parasitic capacitances of the output lines 31a and 31b are made smaller. Furthermore, by dividing the parasitic capacitances into the output lines 31a and 31b, it is also made possible to reduce the amount of electric consumption, because the amount of electric charge and discharge in case that mismatch is found can be divided.

Third Embodiment

Figure 6:
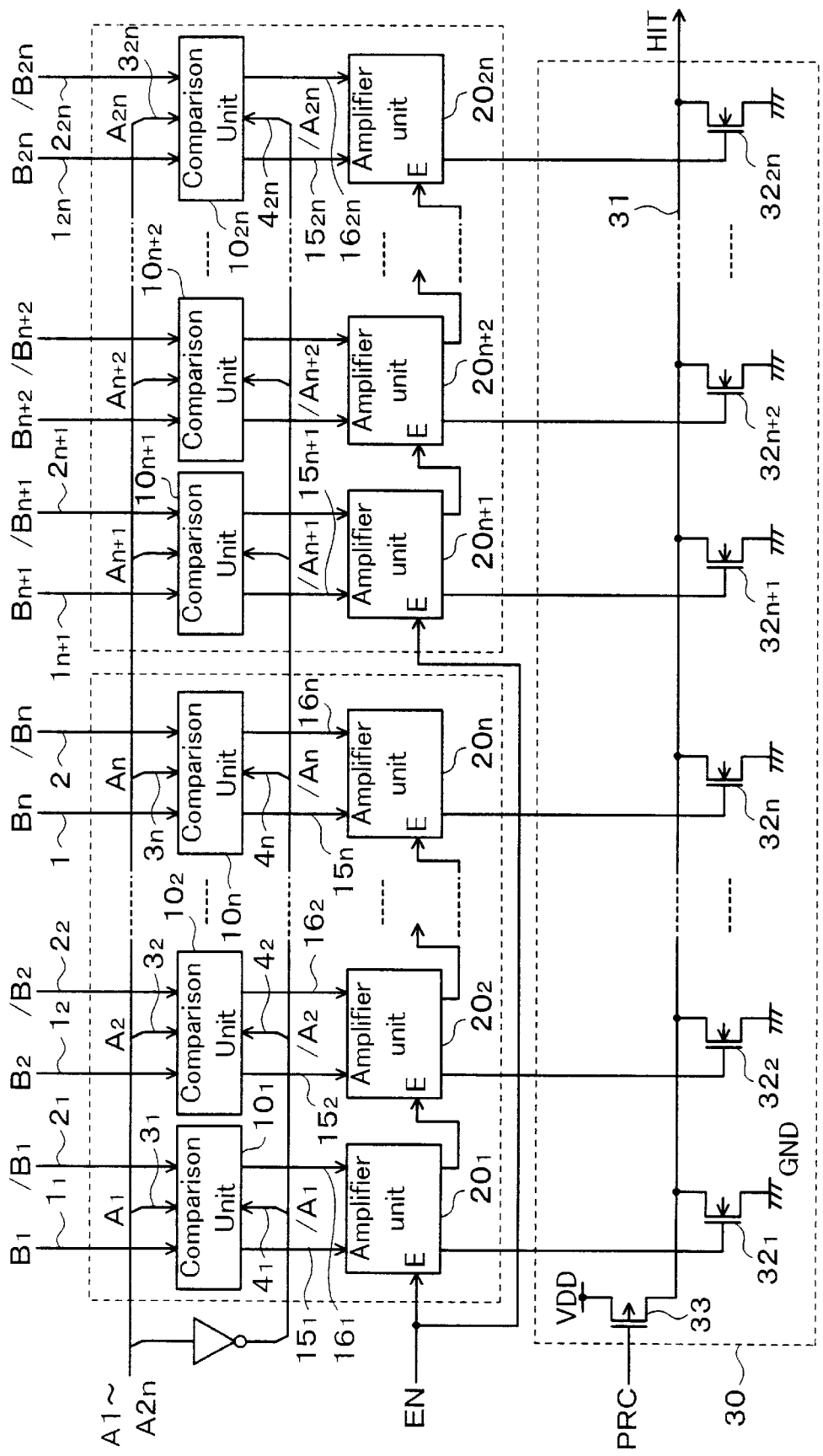
FIG. 6 is a block diagram illustrating the multi-bit match detection circuit according to the third embodiment of the present invention.

FIG. 6 is a block diagram illustrating a multi-bit match detection circuit according to the third embodiment of the invention. It is to be noted that in FIG. 6, the same reference numbers in FIG. 1 are assigned to components having approximately the same functions and structural features.

In the multi-bit match detection circuit according to the third embodiment of the invention, the design of connecting the enable signal ENi with the amplifier units $20_2$ to $20_n$ and $20_{n+2}$ to $20_{2n}$ is modified.

Similar to the multi-bit match detection circuit accroding to the first embodiment of the invention, the enable signal EN for starting comparison operation is commonly applied to the terminals E of the first stage amplifier unit $20_1$ of the first group and the first stage amplifier unit $20_{n+1}$ of the second group. The output line of $16_1$ of the amplifier unit $20_1$ is connected with the terminal E of the amplifier unit $20_2$, whereas the output line $16_{n+1}$ of the amplifier unit $20_{n+1}$ is connected with terminal E of the amplifier unit $20_{n+2}$.

On the other hand, the terminals E of the amplifier unit $20_3, \ldots, 20_n$ of the first group are connected with the output lines $16_2, \ldots, 16_{n-1}$ of the preceding amplifier units $20_n$ to $20_{n-1}$, respectively. Similarly, the terminals E of the amplifier unit $20_{n+3}, \ldots, 20_{2n}$ of the second group are connected with the output lines $16_{n+2}, \ldots, 16_{2n-1}$ of the preceding amplifier units $20_{n+2}, \ldots, 20_{2n-1}$, respectively. The other structures of the multi-bit match detection circuit according to the third embodiment of the invention are identical to the multi-bit match detection circuit according to the first embodiment of the invention.

In the multi-bit match detection circuit according to the third embodiment of the invention, the operation of the amplifier units $20_2$ to $20_n$ of the first group and the amplifier units $20_{n+2}$ to $20_{2n}$ of the second group are controlled by the output line $16_i$ of their preceding amplifier units $20_1$ to $20_{n-1}, 20_{n+1}$ to $20_{2n-1}$. In other words, the amplifier unit $20_i$ is activated only when the comparison result of the preceding stage shows "match". For example, if the address signal Ai and the read signal Bi do not match, the output line $15_i$ of the amplifier unit $20_i$ is at "H" level, whereas the output line $16_i$ is at "L" level. With this, the NMOS $32_i$ is turned on to switch the detection signal HIT on the output line 31 to "L" level, and the detection result indicating "mismatch" is thereby output. On the other hand, the succeeding amplifier units $20_{i+1}, \ldots$ of the same group are not activated.

As mentioned above, according to the multi-bit match detection circuit of the third embodiment of the invention, the bits to be compared are divided in to two groups, i.e. the first group and second group. Each group compares the address signal Ai and the read signal Bi bit by bit, and when the mismatch bits are found, the comparison of the succeeding bits are terminated and the detection signal HIT is output. Accordingly, it is made possible to reduce electric consumption compared with the match detection circuit in which all the bits are compared at a time, at the same time, the multi-bit match detection circuit according to the present invention operates at higher speed than the tag comparator in the prior arts shown in FIG. 2, which compares every bit one by one.

Fourth Embodiment

Figure 7:
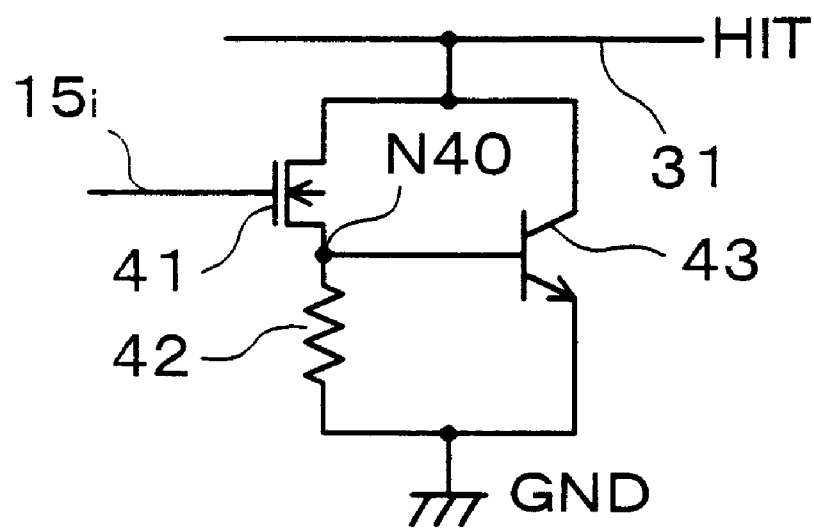
FIG. 7 is a block diagram illustrating the multi-bit match detection circuit according to the fourth embodiment of the present invention.

FIG. 7 is a block diagram of a pull down unit illustrating the fourth embodiment of the present invention.

The pull down unit is employed to replace the NMOS $32_1$ to $32_{2n}$ of the first to third embodiment of the invention as shown in FIGS. 1, 5 and 6, which pulls down the output line 31 at high speed to set the detection signal at "L" level, when the output line $15_i$ outputs a signal at "H" level indicating "mismatch".

The pull down unit has an NMOS 41, drain of which is connected with the output line 31. The gate of the NMOS 41 is connected with the output line $15_i$, whereas the source thereof is connected with a node N40. The node N40 is connected to the ground potential GND through a resistance 42. In addition, the pull down unit 40 further comprises a NPN type TR 43, collector of which is connected with the output line 31, base of which is connected with the node N40, and emitter of which is connected with the ground potential GND, respectively.

In the pull down unit structured as mentioned above, when the output line $15_i$ get to "H" level, the NMOS 41 is turned on, and electric current flows from the output line 31 through the resistance 42, thereby the potential of the node N41 rises. As a result, the TR43 is turned on, and the output line 31 is pulled down to the ground potential GND through the TR43 so that the electric charge on the output line 31 is discharged rapidly.

As mentioned above, the pull down unit according to the fourth embodiment of the invention is structured so that the TR43 pulls down the output line 31. With this, comparing with the NMOS $32_i$ according to the first embodiment of the invention, driving current can be made increased with scarcely increasing the parasitic capacitances. Therefore, the multi-bit match detection circuit according to the fourth embodiment of the invention is advantageous in that the operation at high speed can be realized when the mismatch bits are found.

As is explained so far, according to the first embodiment of the invention, the multiple amplifier units which amplify the detection signals output from the decision unit are divided into two amplifier groups. The circuit of the invention is designed so that when the output signal indicating match of the corresponding bits is output from the first amplifier unit, the other amplifier units in the same group start operation at a time. With this structure, it is made possible to reduce electric consumption compared with the match detection circuit in which all the bits are compared at a time, at the same time, the multi-bit match detection circuit according to the present invention operates at higher speed than the multi-bit match detection circuit, which compares every bit one by one. Moreover, it is also advantageous in that time required to obtain the comparison result is always stable.

According to the second embodiment of the invention, the multiple amplifier units which amplify the detection signals output from the decision unit are divided into two or more amplifier groups. The circuit of the invention is designed so that when the output signal indicating match of the corresponding bits is output from the preceding amplifier unit, the amplifier unit succeeding said amplifier unit starts operation sequentially. With this structure, compared with the multi-bit match detection circuit according to the first embodiment of the invention, it is made possible to reduce electric consumption although time required for operation is increased.

According to the third embodiment of the invention, the decision unit is divided into the multiple decision groups corresponding to the amplifier groups of the amplifier units. The decision unit decides if the read signal and the data signal match based on the detection result of match/mismatch obtained in the each decision group. With this structure, the operation at high speed can be realized because the parasitic capasitances of the wiring and the like in the divided decision unit is reduced. Furthermore, by divining the parasitic capasitances in the decision unit, it is also made possible to reduce the amount of electric consumption, because the amount of electric charge and discharge in case that mismatch is found is divided.

According to the fourth embodiment of the invention, the multi-bit match detection circuit of the invention comprises the output line which outputs the first logic level when the read signals and data signals match, but outputs the second logic level when the read and data signals do not match, the MOS which charges the output line to the first logic level before match/mismatch decision, the multiple TR which connects the output line to the second logic level when the mismatch is found by the output signal. With this structure, the operation at high speed can be realized because the output line is set to the second logic level immediately when mismatch is found.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance:
(a) According to the first to third embodiment of the invention shown in FIGS. 1, 5 and 6, the comparison units 10$_i$ and the amplifier units 20$_i$ are divided in two groups. However, the number of groups are not limited to two. In addition, the number of the amplifier units 20$_i$ in each group is not necessarily the same.
(b) The structure of the circuit of the comparison unit 10$_i$ is not limited to the structure shown in FIG. 3. Any circuits which compares the complementary read signal Bi, /Bi read out from the memory cells with the data signal Ai can be applied.
(c) The structure of the circuit of the amplifier unit 20$_i$ is not limited to the structure shown in FIG. 3. Any circuits which amplifies the complementary detection signals output from the comparison unit 10$_i$ so as to output the output signal at the predetermined logic level can be applied.
(d) A pull up resistor can be replaced with the PMOSs 33, 33$a$, 33$b$.
(e) A NMOS of which gate and drain are connected is replaced with the resistance 42 shown in FIG. 7 as a resistance element.

The entire disclosure of Japanese Patent Application No. 10-236802 filed of Aug. 24, 1998 including specification, claims, drawings and summary is incorporated herein by reference in its entirety.

The entire disclosure of Japanese Patent Application No. 10-236802 filed on Aug. 24, 1998 including specification, claims, drawings and summary is incorporated herein by reference in its entirety.

What is claimed is:

1. A multi-bit match detection circuit, comprising:
multiple comparison units which compare multiple complementary read signals read out from memory cells with corresponding multiple-bit data signals, which are the object of comparison bit by bit, and output complementary detection signals which indicate match/mismatch of every compared pair;
multiple amplifier units each provided at each comparison unit, which start operation when a control signals for controlling operation is applied, and generate output signals indicating match/mismatch of said every compared pair by amplifying said detection signals to the predetermined logic level, wherein said multiple amplifier units are divided into two or more groups, and when said output signals indicating match of the corresponding bits are output from every first amplifier unit of every amplifier unit group, rest of the amplifier units in every amplifier unit group start operation at a time, and;
a decision unit which decides if said multiple read signals and said multiple data signals match based on the output signals generated by said multiple amplifier units.

2. A multi-bit match detection circuit as claimed in claim 1, wherein said decision unit is divided into multiple decision groups corresponding to said amplifier unit groups of said amplifier units, and it is decided based on the result made by said decision groups if said multiple read signals and said multiple data signals match.

3. A multi-bit match detection circuit as claimed in claim 1, wherein said decision unit comprises an output line with two complementary logic levels which outputs a first logic level when said multiple read signals and said multiple data signal match, and outputs a second logic level when said multiple read signal and said multiple data signal do not match;
an MOS transistor which charges said output line to said first logic level before match/mismatch decision;
multiple bipolar transistors of which conduction are controlled by the output signals output from said multiple amplifier units, and which connect said output line with said second logic level when said output signal indicates mismatch of the read signals and the data signal.

4. A multi-bit match detection circuit, comprising:
multiple comparison units which compare multiple complementary read signals read out from memory cells with corresponding multiple-bit data signals, which are the object of comparison bit by bit, and output complementary detection signals which indicate match/mismatch of every compared pair;
multiple amplifier units each provided at each comparison unit which start operation when a control signals for controlling operation is applied, and generate output signals indicating match/mismatch of said every compared pair by amplifying said detection signals to the predetermined logic level, wherein multiple amplifier units are divided into two or more groups, and when the output signals indicating match of the corresponding bits are output from the preceding amplifier units of every amplifier unit group, the amplifier unit succeeding said amplifier units start operation sequentially; and
a decision unit which decides if said multiple read signals and said multiple data signals match based on the output signals generated by said multiple amplifier units.

5. A multi-bit match detection circuit as claimed in claim 4, wherein said decision unit is divided into multiple decision groups corresponding to said amplifier unit groups of said amplifier units, and it is decided based on the detection results of every decision group whether or not said multiple read signal and said multiple data signal match.

6. A multi-bit match detection circuit as claimed in claim 5, wherein said decision unit comprises an output line with two complementary logic levels which outputs a first logic level when said multiple read signal and said multiple data signal match, and outputs a second logic level when said multiple read signal and said multiple data signal do not match;

an MOS transistor which charges said output line to said first logic level before match/mismatch decision;

multiple bipolar transistors of which conduction are controlled by the output signals output from said multiple amplifier units, and which connect said output line with said second logic level when said output signal indicates mismatch of the read signal and the data signal.

* * * * *